(12) United States Patent
Cheng

(10) Patent No.: US 6,236,086 B1
(45) Date of Patent: *May 22, 2001

(54) ESD PROTECTION WITH BURIED DIFFUSION

(75) Inventor: Wen-Bor Cheng, Tainan (TW)

(73) Assignee: Macronix International Co., Ltd., Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,103

(22) Filed: Apr. 20, 1998

(51) Int. Cl.$^7$ .............. H01L 23/62; H01L 29/76; H01L 29/94; H01L 31/062; H01L 31/119

(52) U.S. Cl. .............. 257/355; 257/333; 257/387; 257/389; 257/336; 257/358; 257/346

(58) Field of Search .................. 257/336, 344, 257/408, 382, 355, 356, 546, 333, 358, 360, 387, 389, 346

(56) References Cited

U.S. PATENT DOCUMENTS

| 5,239,440 | 8/1993 | Merrill | 361/91 |
|---|---|---|---|
| 5,262,344 | 11/1993 | Mistry | 437/57 |
| 5,276,350 | 1/1994 | Merrill et al. | 257/603 |
| 5,281,841 | * 1/1994 | Van Roozendaal et al. | 257/360 |
| 5,301,084 | 4/1994 | Miller | 361/91 |
| 5,371,391 | * 12/1994 | Sato | 257/387 |
| 5,455,444 | * 10/1995 | Hsue | 257/413 |
| 5,621,236 | * 4/1997 | Choi et al. | 257/389 |
| 5,635,746 | 6/1997 | Kimura et al. | 257/382 |
| 5,663,082 | 9/1997 | Lee | 438/234 |
| 5,712,753 | 1/1998 | Yeh et al. | 361/56 |
| 5,715,127 | 2/1998 | Yu | 361/56 |
| 5,716,860 | 2/1998 | Huang | 437/34 |
| 5,728,612 | 3/1998 | Wei et al. | 438/200 |

OTHER PUBLICATIONS

Duvvury, C. et al., "Internal Chip ESD Phenomena Beyond the Protection Circuit", IEEE Transactions on Electron Devices, vol. 35, No. 12, Dec. 1988, pp. 2133–2139.

Duvvury, C. et al., "Achieving Uniform nMOS Device Power Distribution for Sub–micron ESD Reliability", IEDM 92–131, IEEE (1992), pp. 6.1.1–6.1.4.

Amerasekera, A. et al., "The Impact of Technology Scaling on ESD Robustness and Protection Circuit Design", EOS/ESD Symposium Proceedings 1994, Las Vegas, NV, Sep. 27–29, 1994, pp. 6.1.1–6.1.9.

Duvvury, C. et al., "Dynamic Gate Coupling of NMOS for Efficient Output ESD Protection", IEEE Electron Devices Society, 30th Annual Proceedings, Reliability Physics 1992, San Diego, CA Mar. 31, Apr. 1, 2, 1992, pp. 141–150.

Duvvury, C. et al., "Output ESD Protection Techniques for Advanced CMOS Processes", 1988 EOS/ESD Symposium Proceedings, pp. 206–211 (1988).

(List continued on next page.)

Primary Examiner—Eddie C. Lee
Assistant Examiner—Jesse C. Fenty
(74) Attorney, Agent, or Firm—Mark A. Haynes; Haynes & Beffel LLP

(57) ABSTRACT

An ESD protection circuit with buried diffusion and internal overlap coupling capacitance is used to lower trigger voltage and create a compact protection circuit area. This protection circuit can be applied to memory and logic products and can be employed in power bus, input, and output pins to protect against ESD. The manufacturing process of this high-performance protection circuit is compatible with non-volatile memory process without an additional mask layer step.

36 Claims, 7 Drawing Sheets

OTHER PUBLICATIONS

Chatterjee, A. et al., "A Low–Voltage Triggering SCR for On–Chip ESD Protection at Output and Input Pads", IEEE Electron Device Letters, vol. 12, No. 1, Jan. 1991, pp. 21–22.

Johnson, C., et al., "Two Unusual HBM ESD Failure Mechanisms on a Mature CMOS Process", EOS/ESD Symposium Proceedings 1993, Lake Buena Vista, FL, Sep. 28–30, 1993, pp. 5B.4.1–5B.4.7.

Duvvury, C. et al., "ESD Protection Reliability in $1\mu M$ CMOS Technologies", IEEE Electron Devices Society 24th Annual Proceedings, Reliability Physics 1986, Anaheim, CA Apr. 1–3, 1986, pp. 199–205.

Polgreen, T., "Improving the ESD Failure Threshold of Silicided nMOS Output Transistors by Ensuring Uniform Current Flow", 1989 EOS/ESD Symposium Proceedings, pp. 167–174 (1989).

* cited by examiner

ESD PROTECTION WITH BURIED DIFFUSION

BACKGROUND

1. Field of Invention

This invention relates to an electrostatic discharge protection circuit for metal-oxide semiconductor (MOS) devices in integrated circuit.

2. Description of Related Art

ESD results when electrostatic charge is collected and rapidly discharged in a short duration, high voltage pulse. Such a discharge results from the contacting of a charged object with the integrated circuit. Both equipment and personnel can acquire substantial amounts of electrostatic charge that can subsequently be transferred to an integrated circuit during manufacture or usage. The human body, for example, can generate charges exceeding 2000 V. Static charge is commonly picked up when a person handling the circuit brushes it against a garment. Electrostatic voltages can also originate from poorly grounded equipment and noisy environments. Conventional approaches to the ESD problem have been to provide the protected circuit with devices that can intervene to deflect ESD charges towards the ground.

As integrated circuit devices are made smaller, ESD damage is more likely to occur. MOS devices are particularly sensitive to high voltage discharges due to the liability of rupture of the thin gate oxide. Unfortunately, the performance of ESD protection devices have been negatively impacted by advanced fabrication processes such as lightly doped drain (LDD), silicided diffusion, and thinner oxides. In order to prevent damage to internal circuits, an on-chip ESD circuit, such as the one disclosed by this invention, must be triggerable and able to dissipate built-up power at a voltage substantially below the breakdown voltage for the components on the chip.

Some prior art protection devices include thick field devices (TFD), shown in FIG. 1, and grounded gate thin oxide NMOS (GGNMOS), shown in FIG. 2. Both of these conventional protection devices are based on MOS transistors that operate as NPN bipolar transistor under ESD conditions, where the drain and the source regions act as collector and emitter, respectively, and the base is provided by the region in the substrate between the drain and the source. A graph of I-V characteristic of NPN bipolar transistors is shown in FIG. 3. When voltage reaches trigger voltage Vtri, the NPN bipolar turns on and enters into snapback region of low impedance so as to dissipate high ESD energy. In order to be effective, the protection device must be turned on by a lower voltage (trigger voltage) than the breakdown voltage of the internal circuit. The snapback voltage (Vsp) is also important; the protection device with low snapback voltage can dissipate higher current and achieve higher ESD performance. In general, a good protection circuit must have both low trigger voltage and low snapback voltages.

The higher trigger voltage levels inherent to the conventional TFD and GGNMOS of the prior art render them ineffective power bus ESD protectors; their trigger voltages tend to be too high to protect the weaker internal circuits. Furthermore, advanced processes, such as the salicide process and the use of thinner oxide layers, have further reduced the ESD performance of these prior art devices. Therefore, more and more ESD damage is occurring despite the use of the TFD and GGNMOS approaches.

LDD NMOS itself can be used as a protection device; however, the doped n− region of an LDD transistor induces non-uniform current distribution and local hot spots, negatively affecting the device's ability to provide protection. As devices shrink in size, the negative effects of local hot spots and non-uniform current distribution become even more pronounced.

Devices also exist in the art in which an LDD NMOS device is coupled with a RC circuit, as shown in FIG. 5. However, the non-uniformity of current distribution inherent in an LDD device cannot be completely resolved with the coupling of a RC circuit.

In order to avoid the problems produced by the LDD regions, non-LDD devices of prior art have also been used to provide ESD protection. An example of a non-LDD NMOS without the n− implant is shown in FIG. 4. The absence of n− doped regions in such devices avoid completely the problems of non-uniform current distribution and local hot spots, both of which negatively impact the ESD performance of LDD devices. Still, the trigger voltages of such devices are not low enough to prevent internal circuit damage in some settings.

The NMOS devices with salicide (self-aligned silicide) processes of prior art, shown in FIG. 6, have similarly been used to provide ESD protection. However, they generally have low ESD performance due to the small spacing (DS) between contact and gate/diffusion. When the silicide on the conducting contact is very close to the junction edge, as occurs in salicide processes, a current concentration occurs, serving as a source of heat in an ESD event. Consequently, the silicide melts or agglomerates in an ESD event, causing a failure. In order to avoid this problem, silicide blocking mask of prior art is used to increase the distance between contact and gate/diffusion, shown in FIG. 7

Accordingly, it is desirable to provide improved ESD protection circuits.

SUMMARY OF THE INVENTION

The current invention offers solutions to the problems induced by LDD, salicide process, and thinner oxide layers. This invention of buried diffusion NMOS (BDNMOS) has a low trigger voltage so it can be turned on before the protected circuit. This invention has a low snapback voltage so it can enter a snapback region of low impedance quickly to permit the dissipation of high amount of ESD. Furthermore, this invention has improved ESD performance despite the use of advanced processes such as LDD and salicide process. Finally, this invention has a compact layout to save protection circuit area, and is compatible with non-volatile memory process without requiring any extra mask layer.

A novel ESD protection circuit is employed for Vdd/Vss power supply protection, input pin protection, output pin protection, and input/output pin protection to avoid internal circuit failure. This ESD protection circuit can be applied to memory products like DRAM, SRAM, EPROM, Mask ROM, and flash memory. Another primary object of this invention is to provide a method of making the protection circuit in combination with normal device manufacturing processes.

The device in the present invention is a buried diffusion NMOS (BDNMOS); the diffusion junction is an abrupt junction, achieving uniform ESD current distribution and avoiding the problem of non-uniform current distribution in LDD devices. The spacing between drain contact and diffusion edge in this invention is larger than a conventional LDD device because of the overlap between the gate and buried diffusion region(s) in BDNMOS. Therefore, large capacitance can be obtained without extra layout area. These two factors contribute to the high ESD performance of BDNMOS.

The ESD protection circuit of the present invention is manufactured within a p-well on an integrated circuit substrate. It has a source and a drain region. A gate structure is situated above the channel between the source and the drain, overlapping at least the drain and maybe the source. The gate is coupled to Vss (ground) by a structure, such as by a conductor having low resistance, or by coupling resistor made of n-well, n-diffusion, or other types resistors.

Electrical contacts on the source and the drain regions of the circuit are covered with silicide, a metallically conducting compound, and are situated in the portion of the source and/or drain not covered by the gate structure.

The buried diffusion NMOS protection devices offered in the present invention can be produced alongside regular MOS devices by using an extra implant mask, without an additional thermal cycle. In one embodiment, a RC gate is coupled to the device to lower the trigger voltage of the device to ensure that the protection circuit is turned on before the protected circuit. The capacitance is formed by overlap between the buried diffusion and the gate to minimize layout area. The resistance is by n-well, n-diffusion or other type of resistors between gate and Vss (ground), including using a MOS device as an active resistor.

Another embodiment of the present invention is the use of an enhanced channel implant (cell implant) to reduce trigger voltage. This channel implant will be of the same conductivity type as the background material upon which the device is built. The preferred embodiment of the present invention is to combine gate-coupling technique and extra channel implant to minimize trigger voltage.

The ESD circuit can be fabricated along with other LDD MOS devices. A source region and a drain region are first formed for the BDNMOS device. Insulating layers of oxide are grown by thermal oxidation over the surface of the p-well, forming thick oxide over the diffusion areas, and thinner oxide elsewhere. Gates are then formed over the insulating layer. In particular, a gate is formed above the channel region connecting the drain and source regions of the BDNMOS. Spacers are etched on both sides of the gates. Ions are then implanted into the LDD MOS section to formed the n– doped LDD regions, followed by implantation of n+ ions to form the source and drain regions of the LDD MOS devices, and extensions of source and drain regions of BDNMOS devices.

The present invention can provide excellent ESD protection for data signal terminals such as input, output, and input/output pins, and for power bus terminals.

DETAILED DESCRIPTION OF THE FIGURES

The following description will illustrate the components and operation of the invention. Non-limiting embodiments will be provided to offer a clear conception of the advantages and features constituting the invention.

Figure 1:
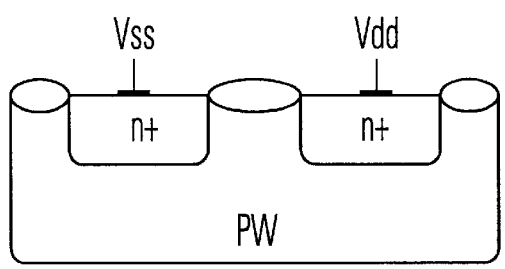
FIG. 1 is a cross-sectional view of a prior art Thick Field Device.
Figure 2:
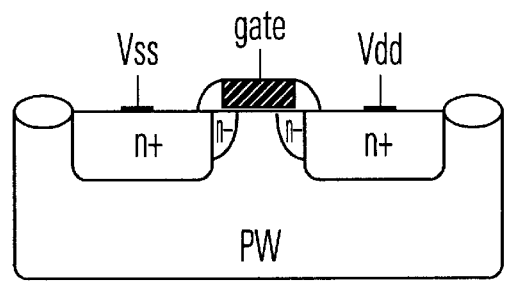
FIG. 2 is a cross-sectional view of a prior art normal LDD NMOS with n– implant.
Figure 3:
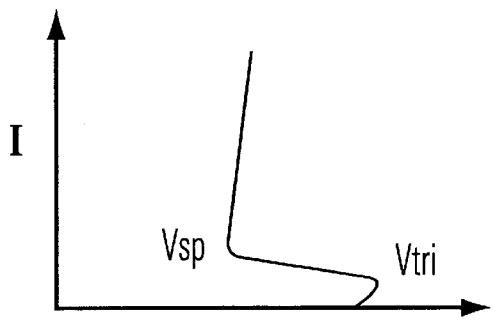
FIG. 3 is a typical graph of I-V characteristic of the prior art grounded-gate NMOS.
Figure 4:
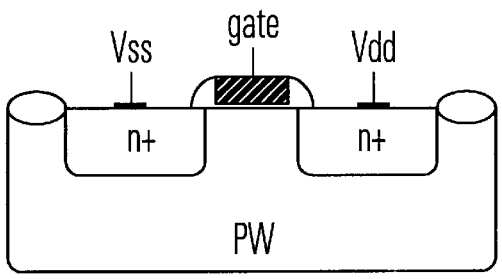
FIG. 4 is a cross-sectional view of a prior art non-LDD NMOS.
Figure 5:
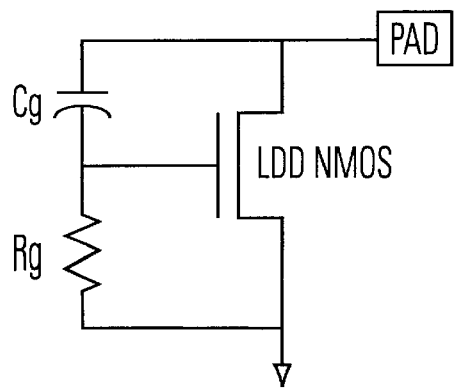
FIG. 5 is a schematic electrical diagram of a prior art RC gate-coupled LDD NMOS.
Figure 6:
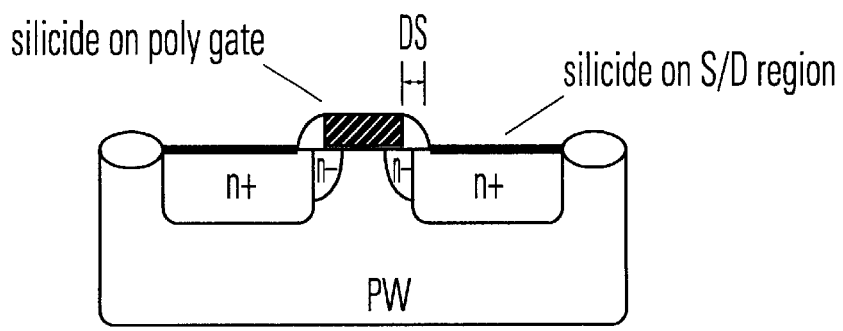
FIG. 6 is a cross-sectional view of a normal prior art LDD NMOS with salicide process.
Figure 7:
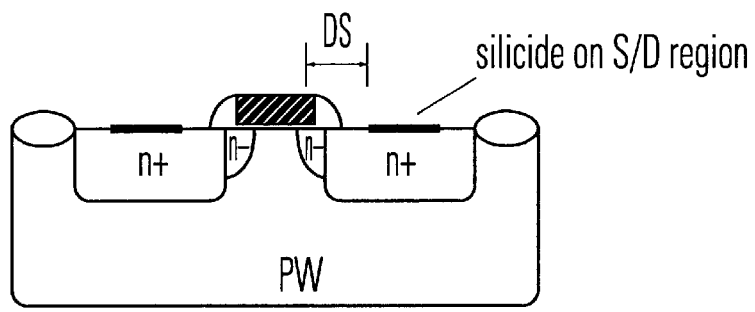
FIG. 7 is a cross-sectional view of a normal prior art LDD NMOS with silicide blocking mask.
Figure 8:
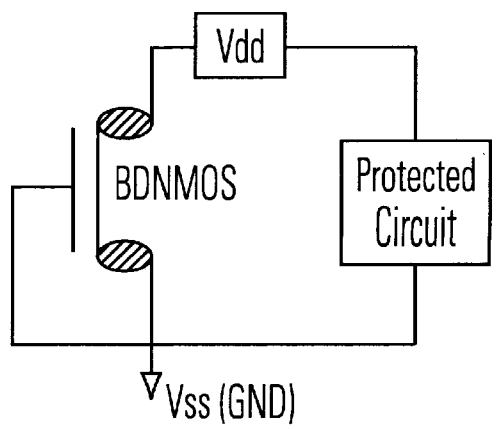
FIG. 8 is a schematic electrical diagram illustrating an ESD protection circuit of the present invention connected to the Vdd power supply bus and the protected integrated circuit.

FIG. 8 shows a BDNMOS being used as a Vdd/Vss power bus protection device, and the gate of the BDNMOS is grounded. When Vdd is static and within normal operation range, BDNMOS is off. When Vdd reaches above the threshold voltage of the BDNMOS, such as in an ESD event, the BDNMOS is turned on to dissipate electric charge. Thus, the protected circuit will not be damaged in an ESD event. Trigger voltage of a BDNMOS is dependent on many factors, including substrate material, gate bias, electric field between the drain and the gate, etc. If the trigger voltage of a BDNMOS is too high, the it may not trigger quickly enough to protect the protected circuit. On the other hand, if the trigger voltage of BDNMOS is unduly low, it may trigger inappropriately, or even all the time. Finally, several BDNMOS's can also be connected in parallel to provide even more protection for the protected circuit.

Figure 9:
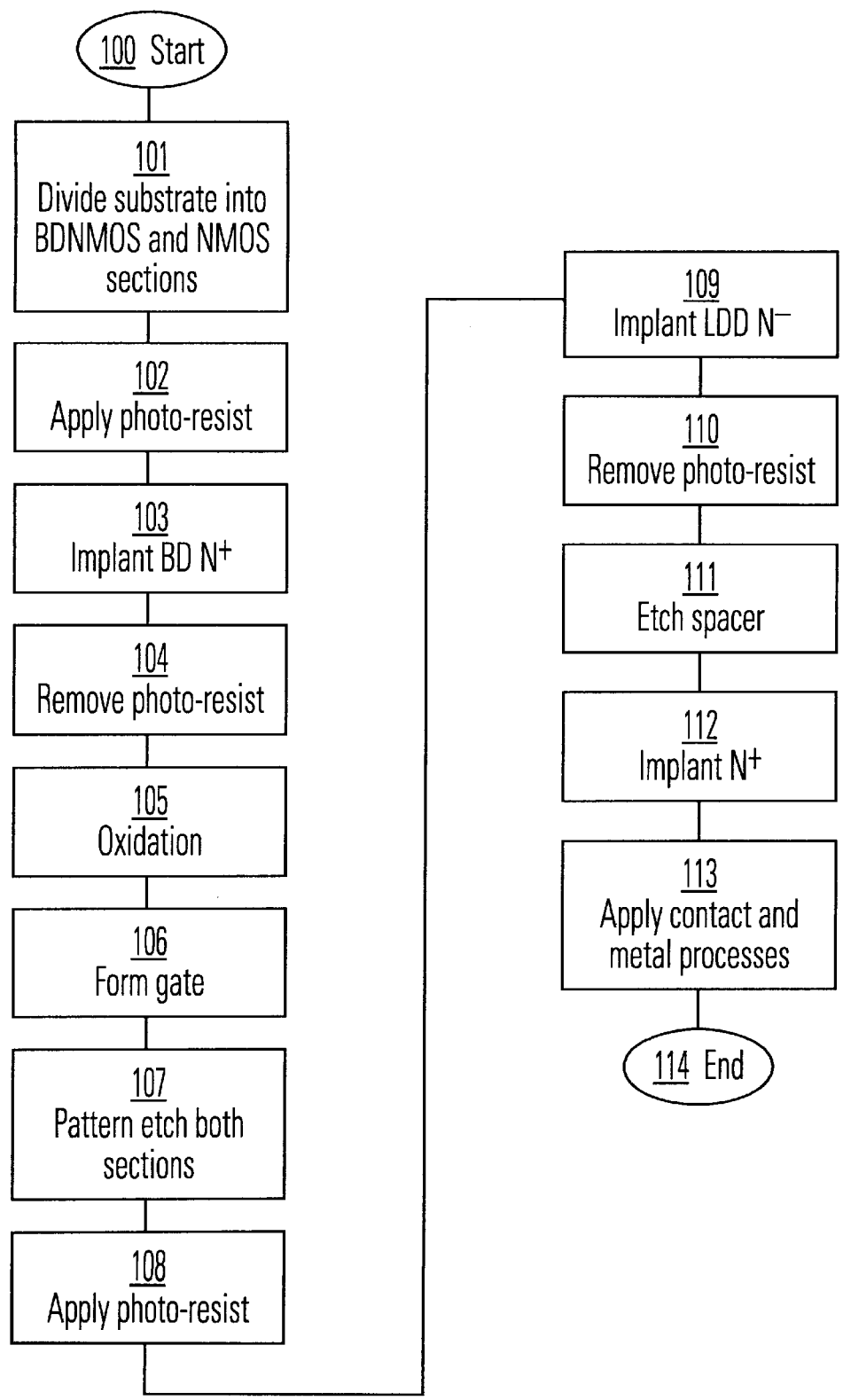
FIG. 9 is a flow diagram of the manufacturing process of an integrated circuit within a p-well or p-substrate including a MOS transistor and a buried-diffusion NMOS (BDNMOS), the ESD protection circuit.
Figure 10:
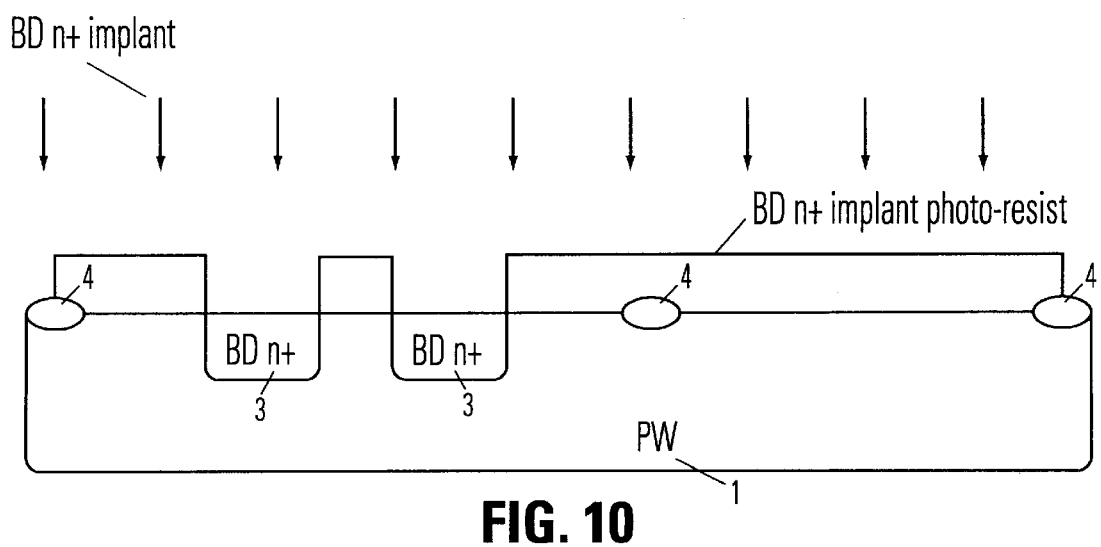
FIG. 10 is schematic diagram of the manufacturing step of implanting n+ material in the ESD protection circuit section of the well.

FIGS. 9–15 illustrate the process of manufacturing a protection circuit within a p-well in a semiconductor substrate to protect against the damage from ESD. FIG. 9 presents in summary in a flow diagram form the manufacturing steps of producing an ESD protection circuit and an LDD NMOS circuit simultaneously. The details of each step are more fully set out in FIGS. 10–15. First, step 101 of FIG. 9 indicates that the p-well 1 is divided into sections, separated by isolation oxides 4. The left section of p-well 1 forms the buried diffusion NMOS (BDNMOS), the ESD protection device, and the right section forms the LDD NMOS. Step 102 of FIG. 9 is shown in FIG. 10 in which the surface of the p-well is coated with photoresist to protect the rest of the surface as n+ ions are implanted in the protection circuit section of the substrate. The concentration of n+ ions in the left section forms the buried diffusion (BD) regions 3 of the BDNMOS. The preferred buried diffusion n+ implant is arsenic with preferred dose of about 1~3E15 atoms/cm². No n+ implant is necessary for LDD NMOS. These processes are also summarized in FIG. 9 as steps 103 and 104.

Figure 11:
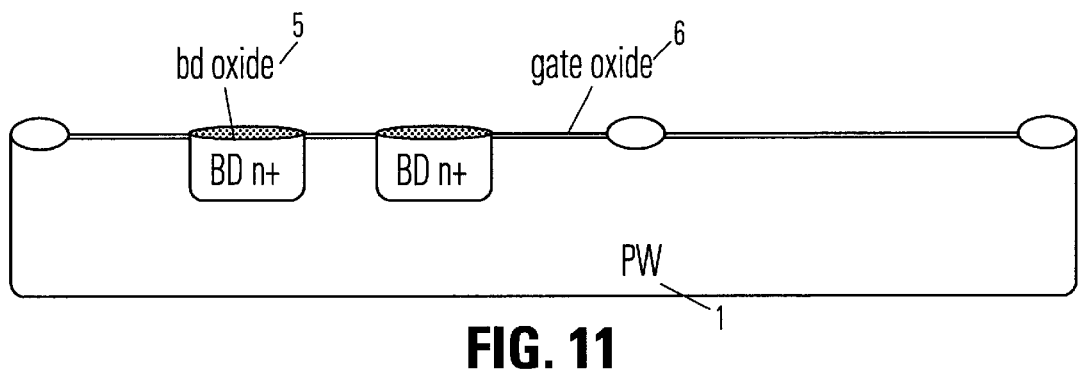
FIG. 11 is the schematic diagram of the manufacturing step in which thick oxide around the diffusion region and thin gate oxide are grown by thermal oxidation.
Figure 12:
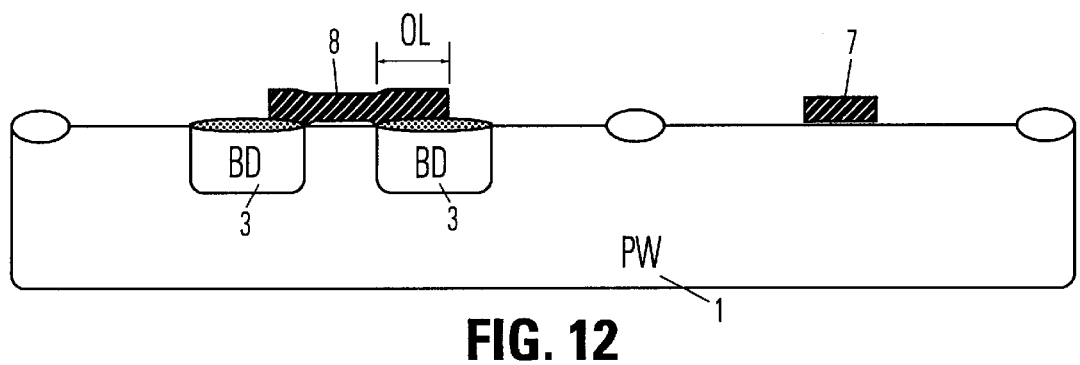
FIG. 12 is the schematic diagram of the manufacturing step in which a gate is formed for the protection circuit section and the MOS section of the well.

FIG. 11 shows the thin layers of gate oxide 6 and the thicker layers of oxide 5 above the buried diffusion (also refer to step 105 in FIG. 9) are grown by means of thermal oxidation. The process continues in FIG. 12, and a gate electrode 8 is formed, by deposition of polysilicon, for the protection circuit section of the p-well, overlapping partially the buried diffusion regions 3 of the BDNMOS. The preferred overlap region is about 2 to 4 µm for products without silicide. The preferred overlap region is about 4 to 6 µm for products with silicide. A gate electrode 7 is also formed for the LDD NMOS transistor P-well (steps 106, 107 of FIG. 9).

Figure 13:
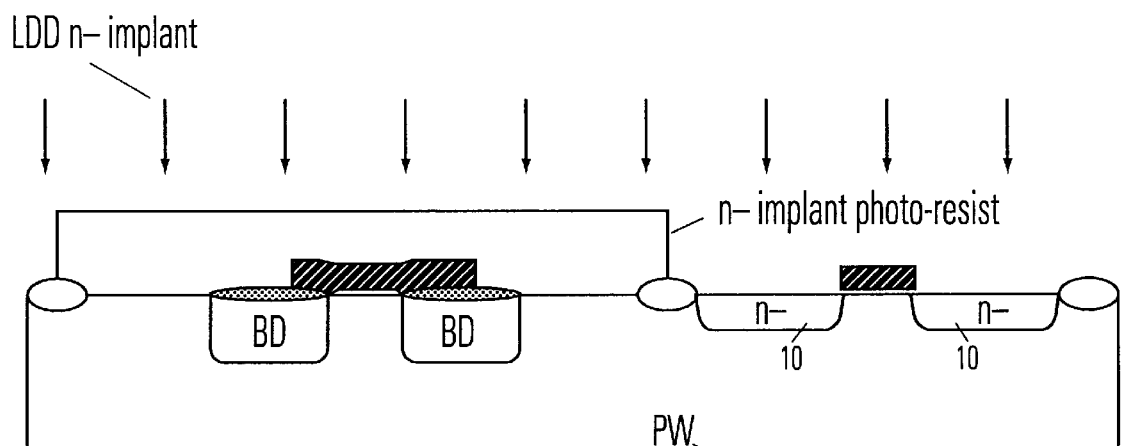
FIG. 13 is the schematic diagram of the manufacturing step in which n– material is implanted to form the n– type LDD regions on the NMOS section of the substrate.
Figure 14:
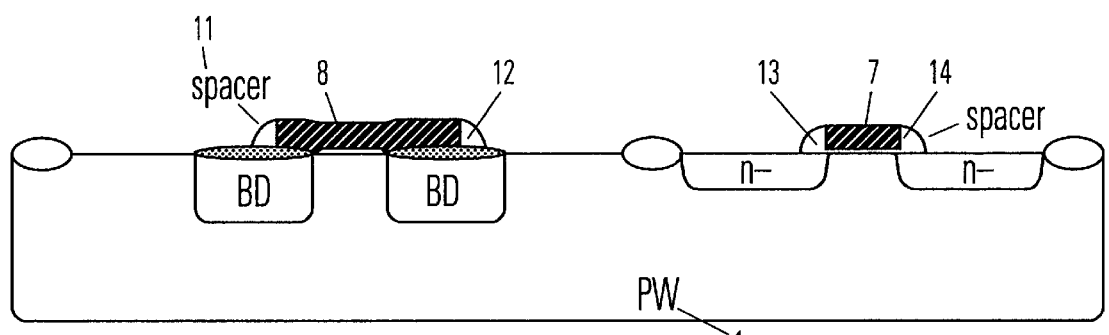
FIG. 14 is the schematic diagram of the manufacturing step of etching spacers for the gates in the protection circuit section and NMOS section of the well.

FIG. 13 shows the step during which n− ions are implanted into the LDD NMOS section of p-well 1, forming the LDD regions 10 for the NMOS of this section (steps 108, 109 of FIG. 9). The preferred n− implant material is phosphorous with preferred dose of about 1~3E13 ions/cm². No n− implant is necessary for BDNMOS and this section is protected by a coating of photoresist (steps 108, 110 of FIG. 9). FIG. 14 shows the cross-sectional views of the BDNMOS and LDD NMOS after spacers 11, 12, 13, 14 have been etched on both sides of the gates 8 and 7 (also refer to step 111 of FIG. 9).

Figure 15:
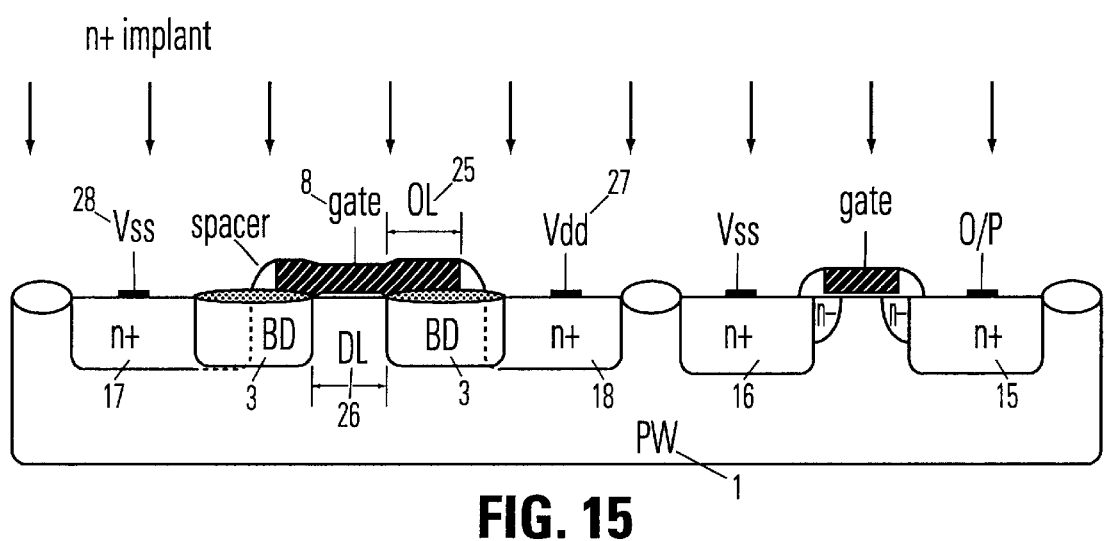
FIG. 15 is the schematic diagram of the manufacturing step of implanting n+ material into the well.

Finally, as shown in FIG. 15, n+ material, preferably arsenic with a dose of about 2~4E15 ions/cm², is implanted into p-well 1 to form extensions 18 and 17 of the BD regions 3 of the BDNMOS, and to form the source 16 and drain 15 of the NMOS (step 112 of FIG. 9). Electrical contacts, which may comprise silicide, are formed for the BDNMOS in portions of diffusion not overlapped by the gate. Contacts can be in BD extensions 18 and 17; alternatively, contacts can be formed at BD junctions (step 113 of FIG. 9).

At the end of the fabrication process, as shown in FIG. 15, the ESD circuit is formed within p-well 1 with source 17 and drain 18 doped with n+ ions. The buried diffusion regions 3 located next to the drain and source regions are also implanted with n+ ions. Gate 8 overlaps at least the buried diffusion region next to drain 18, and possibly the buried diffusion region next to source 17. The overlap between the buried diffusion region and the gate is labeled OL (25). The length of the region between the buried diffusion regions is labelled DL (26). Contacts 27 and 28 can be formed either above the source (17) and drain (18) regions, or they be formed at the junction between the buried diffusion regions and the source/drain regions.

Figure 16:
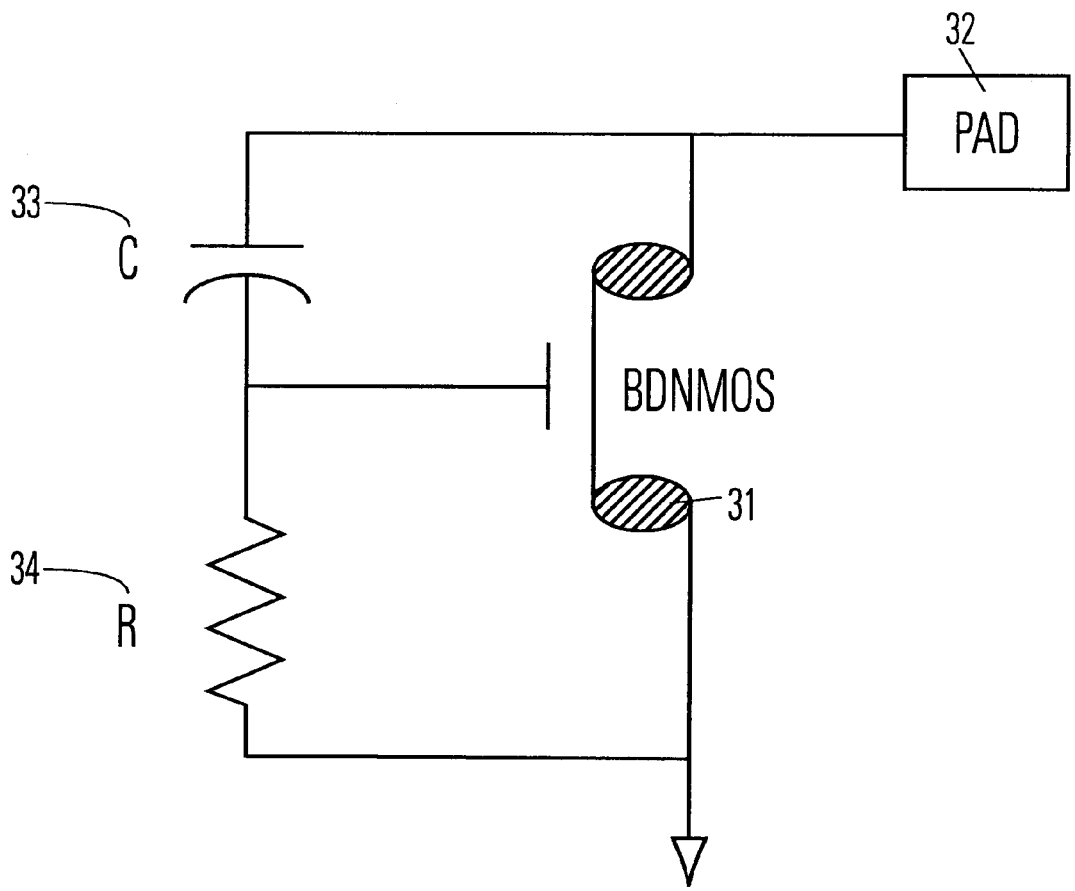
FIG. 16 is the schematic electrical diagram of the RC circuit-coupled BDNMOS.

In one embodiment of the invention, the BDNMOS is coupled with a RC circuit to reduce trigger voltage, as shown in FIG. 16. The capacitor 33 is formed by the overlap between buried diffusion and the gate with preferred capacitance of about 0.1~1.0 pF. The capacitance is a function of the overlap length and protection device width. The resistor 34 is about 10 kΩ and can be implemented by n-well, n-diffusion, or other type of resistors. In another embodiment of the invention a MOS device can be adopted as an active resistor.

Figure 17:
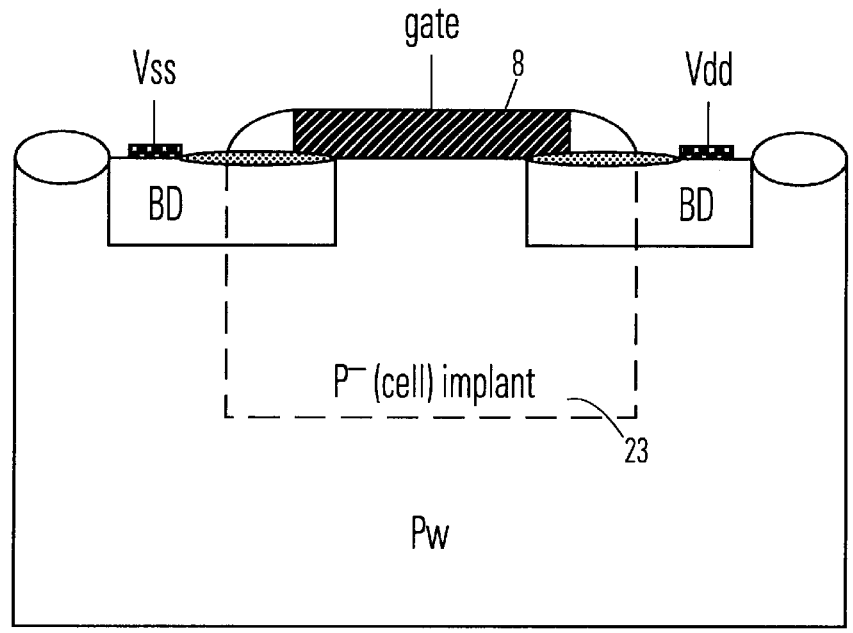
FIG. 17 is the vertical cross-sectional view of the BDNMOS with enhanced p-channel implant.
Figure 18:
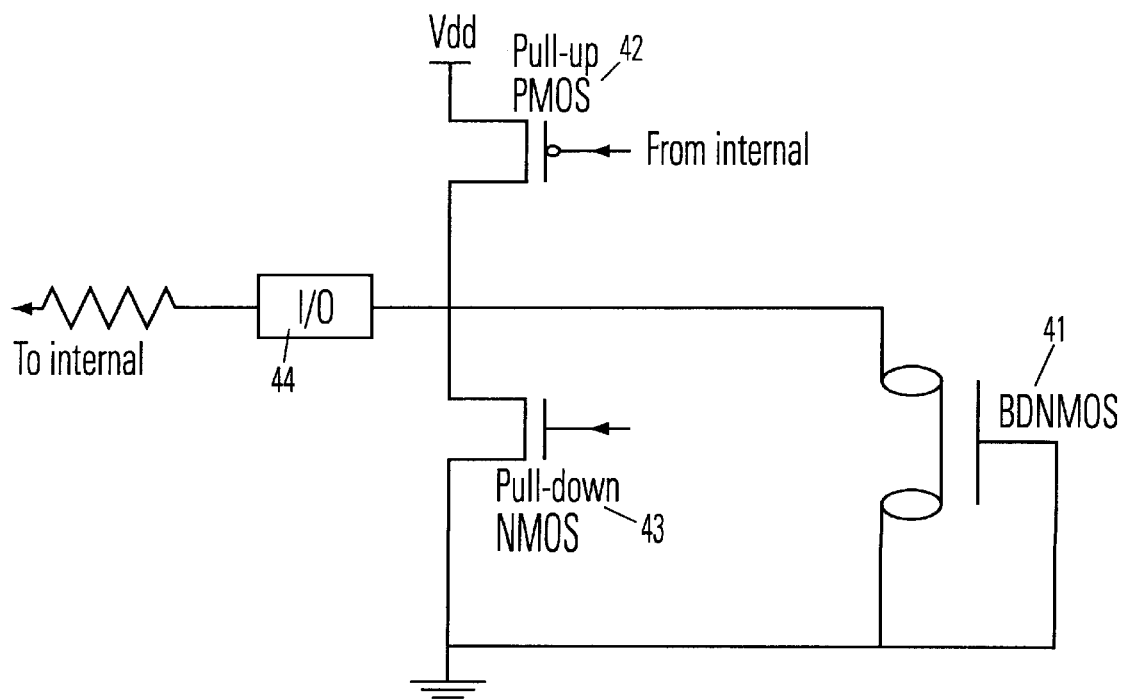
FIG. 18 is the schematic electrical diagram illustrating BDNMOS in parallel with pull-down NMOS and pull-up PMOS devices to prevent damage in the I/O buffer.

FIG. 17 shows yet another embodiment of the invention in which an enhanced p− channel implant 23 is formed before gate oxidation. The preferred implant material is boron with preferred dose of about 1~3E13 ions/cm². This p-channel implant can further reduce trigger voltage and is compatible with cell implant of cell array in non-volatile memory processes. The preferred embodiment of the present invention is to combine RC circuit and p-channel implant to minimize the trigger voltage of the BDNMOS. The BDNMOS 41 can provide an extra ESD discharge current path in parallel with pull-up PMOS 42 and pull-down NMOS 43 to prevent damage to the input/output pad 44, as shown in FIG. 18.

The invention is useful in conjunction with input, output, or input/output pins to prevent gate oxide damage and damage to output devices, or the like. These are other uses for the invention which are not enumerated here. This invention, by utilizing the overlap capacitance between the gate and buried diffusion and the uniform current distribution induced by abrupt junction, offers a compact ESD protection circuit with high performance. The large capacitance of the gate overlap and the large device width enable the BDNMOS to dissipate high electrostatic discharge efficiently. Furthermore, the device of this invention can be fabricated in accordance with advanced CMOS processes. For example, the method of making the invention is compatible with the process steps used to make LDD NMOS.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An electrostatic discharge ESD protection circuit for protected terminals on a semiconductor body, the protected terminals adapted for connection to external signal sources, comprising:

a source and a drain in the semiconductor body, the source and the drain comprising respective n+ regions;

a channel between the source and the drain;

an insulator over the channel and over at least one of the source and the drain, the insulator including a thinner portion over the channel, and a thicker portion over said at least one of the source and the drain which is thicker than the thinner portion;

a gate structure over the insulator and the channel and including a gate extension substantially overlapping the thicker portion of the insulator over said at least one of the n+ regions of the respective source and drain; and electrical contacts on n+ regions of the respective source and drain, one of the contacts connected to one of the protected terminals.

2. The protection circuit of claim 1, wherein the electrical contacts comprise silicide.

3. The protection circuit of claim 1, wherein the semiconductor body has a first conductivity type, and the drain comprises:

a first region comprising dopants of the second conductivity type adjacent the channel, and at least partially covered by the gate structure, and a second region in electrical communication with the first region extending away from the channel and not covered by the gate structure, and wherein the electrical contact on the drain is coupled to the second region.

4. The protection circuit of claim 3, wherein the electrical contact on the drain comprises silicide substantially covering the second region.

5. The protection circuit of claim 1, wherein the semiconductor body has a first conductivity type, and the source comprises:
   a first region comprising dopants of the second conductivity type adjacent the channel, and at least partially covered by the gate structure, and a second region in electrical communication with the first region extending away from the channel and not covered by the gate structure, and wherein the electrical contact on the source is coupled to the second region.

6. The protection circuit of claim 5, wherein the electrical contact on the source comprises silicide substantially covering the second region.

7. The protection circuit of claim 1, comprising a structure coupling the gate structure to ground.

8. The protection circuit of claim 1 including an implant of first conductivity type in the channel to reduce trigger voltage.

9. The protection circuit of claim 1 wherein the gate extension establishes a capacitance between the drain and the gate.

10. The protection circuit of claim 9, wherein the capacitance has a value and a range of about 0.1 to 10 pf.

11. The protection circuit of claim 1 including a resistor between the gate and the ground.

12. The protection circuit of claim 11, wherein the resistor has a resistance of about 1 to 100 kiloOhms.

13. The protection circuit of claim 1, wherein said one of the protected terminals comprises a power supply input terminal.

14. The protection circuit of claim 1, wherein said one of the protected terminals comprises a data signal terminal.

15. The protection circuit of claim 1, the gate extension overlaps the drain by 2 to 6 µm.

16. The protection circuit of claim 1, wherein the semiconductor body comprises p-type silicon, and the source and drain comprise n-type regions in the semiconductor body.

17. An integrated circuit on a semiconductor body and having a plurality of terminals, comprising:
   circuits including MOS transistors on the semiconductor body, and coupled to the plurality of terminals;
   a protected terminal in the plurality of terminals comprising a structure adapted for connection to a signal source off of the semiconductor body; and
   an electrostatic discharge ESD protection circuit coupled to the protected terminal in the plurality of terminals, including
      a source and a drain in the semiconductor body, the source and the drain comprising respective n+ regions;
      a channel and the semiconductor body between the source and the drain;
      an insulator over the channel and the drain, the insulator including a thinner portion over the channel, and a thicker portion over the n+ region of the drain which is thicker than the thinner portion;
      a gate structure over the insulator and the channel and including a gate extension substantially overlapping the thicker portion of the insulator over the n+ region of the drain;
      electrical contacts on the n+ regions of the respective source and drain coupled to the protected terminal on the integrated circuit.

18. The integrated circuit of claim 17, wherein the circuits comprising MOS transistors comprise an array of nonvolatile memory cells and supporting logic.

19. The integrated circuit of claim 17, wherein the circuits comprise MOS transistors having LDD implants, and wherein the ESD protection circuit does not include an LLD implant.

20. The integrated circuit of claim 17, wherein the electrical contacts comprise silicide.

21. The integrated circuit of claim 17, wherein the semiconductor body has a first conductivity type, and the drain comprises:
   a first region comprising dopants of the second conductivity type adjacent the channel, and at least partially covered by the gate structure, and a second region in electrical communication with the first region extending away from the channel and not covered by the first gate extension, and wherein the electrical contact on the drain is coupled to the second region.

22. The integrated circuit of claim 21, wherein the electrical contact on the drain comprises silicide substantially covering the second region.

23. The integrated circuit of claim 17, wherein the semiconductor body has a first conductivity type, and the source comprises:
   a first region comprising dopants of the second conductivity type adjacent the channel, and at least partially covered by the gate structure, and a second region in electrical communication with the first region extending away from the channel and not covered by the second gate extension, and wherein the electrical contact on the source is coupled to the second region.

24. The integrated circuit of claim 23, wherein the electrical contact on the source comprises silicide substantially covering the second region.

25. The integrated circuit of claim 17, comprising a structure coupling the gate structure to ground.

26. The integrated circuit of claim 17 including an implant of first conductivity type in the channel to reduce trigger voltage.

27. The integrated circuit of claim 17 wherein the gate extension establishes a capacitance between the drain and the gate.

28. The integrated circuit of claim 27, wherein the capacitance has a value in a range of about 0.1 to 10 pF.

29. The integrated circuit of claim 25, wherein the structure coupling the gate to ground includes a resistor.

30. The integrated circuit of claim 29, wherein the resistor comprises an implant diffused in the semiconductor body having a connection to the gate structure and a connection to ground.

31. The integrated circuit of claim 29, wherein the resistor has a resistance of about 1 to 100 kiloOhms.

32. The integrated circuit of claim 17, wherein said protected terminal comprises a power supply input terminal.

33. The integrated circuit of claim 17, wherein said protected terminal comprises a data signal terminal.

34. The integrated circuit of claim 17, the gate extension overlaps the drain by about 2 to 6 µm.

35. The integrated circuit of claim 17, wherein the semiconductor body comprises p-type silicon, and the source and drain comprise n-type regions in the semiconductor body.

36. An integrated circuit on a semiconductor body and having a plurality of terminals, comprising:
   circuits including MOS transistors on the semiconductor body, and coupled to the plurality of terminals; and
   an electrostatic discharge ESD protection circuit coupled to a protected terminal in the plurality of terminals, including
      a source and a drain in the semiconductor body;
      a channel and the semiconductor body between the source and the drain;

an insulator over the channel and the drain, the insulator including a thinner portion over the channel, and a thicker portion over the drain which is thicker than the thinner portion;

a gate structure over the insulator and the channel and including a gate extension substantially overlapping the thicker portion of the insulator over the drain;

electrical contacts on the source and the drain coupled to the protected terminal on the integrated circuit;

wherein the circuits comprise MOS transistors having LDD implants, and wherein the ESD protection circuit does not include an LLD implant.

* * * * *